US008009055B2

(12) United States Patent
Lindsey et al.

(10) Patent No.: US 8,009,055 B2
(45) Date of Patent: *Aug. 30, 2011

(54) HIGH VOLTAGE INDICATION SYSTEM

(75) Inventors: Robert Lindsey, Washington, IL (US); Richard Shults, Peoria, IL (US); Curtis Brian Johnson, Peoria, IL (US); Rex Aaron Glover, Deer Creek, IL (US)

(73) Assignee: Caterpillar Inc., Peoria, IL (US)

( * ) Notice: Subject to any disclaimer, the term of this patent is extended or adjusted under 35 U.S.C. 154(b) by 210 days.

This patent is subject to a terminal disclaimer.

(21) Appl. No.: 11/905,333

(22) Filed: Sep. 28, 2007

(65) Prior Publication Data

US 2009/0085759 A1  Apr. 2, 2009

(51) Int. Cl.
*G08B 21/00* (2006.01)
(52) U.S. Cl. ..................... 340/662; 318/650
(58) Field of Classification Search .......... 340/662; 318/254, 798, 439, 800, 650, 108, 805
See application file for complete search history.

(56) References Cited

U.S. PATENT DOCUMENTS

| 3,576,481 | A |   | 4/1971 | Rayburn |
|---|---|---|---|---|
| 3,943,409 | A | * | 3/1976 | Brown ........................... 361/44 |
| 4,285,023 | A | * | 8/1981 | Kalivas ......................... 361/91.1 |
| 4,739,245 | A |   | 4/1988 | Komurasaki et al. |
| 4,943,777 | A |   | 7/1990 | Nakamura et al. |
| 5,608,385 | A |   | 3/1997 | Masaki |
| 5,705,912 | A |   | 1/1998 | Ichihara |
| 5,705,914 | A |   | 1/1998 | Morita |
| 5,781,013 | A |   | 7/1998 | Takahashi |
| 5,869,951 | A | * | 2/1999 | Takahashi ..................... 320/104 |
| 5,955,869 | A | * | 9/1999 | Rathmann |
| 6,091,337 | A | * | 7/2000 | Arshad et al. ................. 340/662 |
| 6,392,316 | B1 | * | 5/2002 | Yoshioka et al. ............... 307/66 |
| 6,434,025 | B2 |   | 8/2002 | Shirai et al. |
| 6,480,114 | B2 | * | 11/2002 | Estelle ........................... 340/662 |
| 6,606,227 | B2 |   | 8/2003 | Rapsinski et al. |
| 6,885,215 | B1 |   | 4/2005 | Hou et al. |
| 6,891,353 | B2 |   | 5/2005 | Tsukamoto et al. |
| 6,906,525 | B2 |   | 6/2005 | Suzuki |
| 6,998,819 | B2 |   | 2/2006 | Jin |
| 7,071,656 | B2 |   | 7/2006 | Taniguchi |
| 7,098,624 | B2 | * | 8/2006 | Kusaka ......................... 318/727 |
| 7,158,041 | B2 |   | 1/2007 | McDonald, Jr. et al. |
| 7,268,505 | B2 | * | 9/2007 | Pant et al. ................. 318/400.01 |
| 2005/0194929 | A1 |   | 9/2005 | Funabashi et al. |

(Continued)

OTHER PUBLICATIONS

Notice of Allowance in U.S. Appl. No. 11/289,291 mailed Oct. 6, 2009 (8 pages).

(Continued)

*Primary Examiner* — George A Bugg
*Assistant Examiner* — Edny Labbees
(74) *Attorney, Agent, or Firm* — Finnegan, Henderson, Farabow, Garrett & Dunner LLP

(57) ABSTRACT

Systems and methods are disclosed for detecting and indicating high-voltage presences on a machine. In one embodiment a high-voltage indication system is disclosed and may include a voltage detector configured to compare the voltage level associated with an element with a threshold voltage value, and provide an indication signal when the voltage level associated with the element is greater than the threshold voltage value. The system may also include an indicator powered by a separate power source independent from the voltage detector. The indicator may be configured to detect the indication signal provided by the voltage detector, and provide one or more warning signals in response to the indication signal.

14 Claims, 3 Drawing Sheets

U.S. PATENT DOCUMENTS

2006/0232247 A1  10/2006  Takase et al.
2007/0103828 A1* 5/2007  Larson et al. .................. 361/88
2007/0120694 A1  5/2007  Lindsey et al.

OTHER PUBLICATIONS

Office Action in U.S. Appl. No. 11/289,291 mailed May 28, 2009 (14 pages).

Office Action in U.S. Appl. No. 11/289,291 mailed Oct. 29, 2008 (14 pages).

Office Action in U.S. Appl. No. 11/289,291 mailed Feb. 20, 2008 (13 pages).

* cited by examiner

HIGH VOLTAGE INDICATION SYSTEM

TECHNICAL FIELD

This application relates to a voltage indication system, and more particularly, to a high-voltage indication system.

BACKGROUND

Electric or hybrid machines are widely used as alternatives to their mechanical counterparts in industrial applications due to their higher efficiency and lower maintenance requirements. These machines typically contain high-voltage electric loads. Large charge-storing devices are usually included to stabilize the high-voltage power system. During normal operation these charge storing devices may be capable of storing several thousand volts of potential energy. The charge-storing devices may store high-voltage charges for substantial amounts of time, even when the machine is powered down. Thus, it may be desirable to detect a high-voltage condition associated with an electric or hybrid machine and provide a warning signal indicative of the high-voltage condition.

Furthermore, it is also important that the indication system is reliable, in particular, the system is desired to have a low false alarm rate. Self-test and diagnostic functions are therefore desirable features of the indication system, to minimize the possibility of both a missing alarm and a false alarm due to malfunction of the indication system.

Yet another factor to consider in the design of the indication system is cost-effectiveness. Since low-power dissipation components are usually available at lower cost, it is generally desirable to use low power dissipation components.

One system for detecting the voltage level of a power source is described in U.S. Pat. No. 6,885,215 to Hou et al. ("the '215 patent"). The '215 patent describes a voltage detector circuit with a programmable threshold point. The detector includes a voltage following circuit connected to a power source for tracking the voltage value of the power source, and a selectable threshold point circuit connected to the voltage following circuit to provide the threshold value. The voltage detector described in the '215 patent is configured to generate an output indicative of whether the value of the power source has increased above or decreased below the threshold value. In one instance, the threshold point is established by the amount of current provided by the threshold point circuit, which may further be determined by the size and type of transistor used in the selectable threshold point circuit.

Although the voltage detection circuit described in the '215 patent may be effective for detecting voltage levels, it may be problematic. For example, the system described in the '215 patent may lack reliability. That is, because the detection circuit of the '215 patent operates exclusively from a primary power source, it may be incapable of operation in the event of a power failure. As a result, equipment systems that rely on continuous voltage detection even in the event of loss of power may become inoperable. Further, the voltage detector disclosed by the '215 patent may lack reliability for the additional reason that it does not provide self-test functions or diagnostic functions, and isolation.

Furthermore, the solution provided by the '215 patent may not be cost effective. For example, in a high-voltage system, the voltage level of the primary power source is usually high as well. Directly powering the entire detection circuit from such a high-voltage source requires high-power dissipation components, which are typically more expensive than low-power dissipation components.

In addition, the system described in the '215 patent may provide insufficient isolation between the detection circuitry and the processor circuitry. As a result, transient signals, such as voltage or current spikes, may damage the processor circuitry and/or other systems that are in contact with the detection circuitry. Component failure in the detection circuits may cause a hazardous condition within the indication or alarm circuits which may be in close proximity to an operator.

Finally, the voltage detection circuit described in the '215 patent may lack indication capability of high-voltage conditions associated with the electric machine, and self-test and diagnostic functions that are necessary to monitor the operation status of the detection circuit.

The disclosed high-voltage indication system is directed towards overcoming one or more of the problems set forth above.

SUMMARY OF THE INVENTION

In one aspect, the present disclosure is directed to a high voltage indication system. The high-voltage indication system may include a voltage detector configured to compare the voltage level associated with an element with a threshold voltage value, and provide an indication signal when the voltage level associated with the element is greater than the threshold voltage value. The system may also include an indicator powered by a separate power source independent from the voltage detector. The indicator may be configured to detect the indication signal provided by the voltage detector, and provide one or more warning signals in response to the indication signal.

In another aspect, the present disclosure is directed toward a method of indicating a high-voltage condition. The method may include comparing a voltage level of an element with a threshold voltage value, and generating and transmitting an indication signal when the voltage level exceeds the threshold voltage value. The method may further include receiving the indication signal, and generating one or more warning signals to indicate the high-voltage condition. The method may also include independently powering the indication of high-voltage.

DETAILED DESCRIPTION

Figure 1:
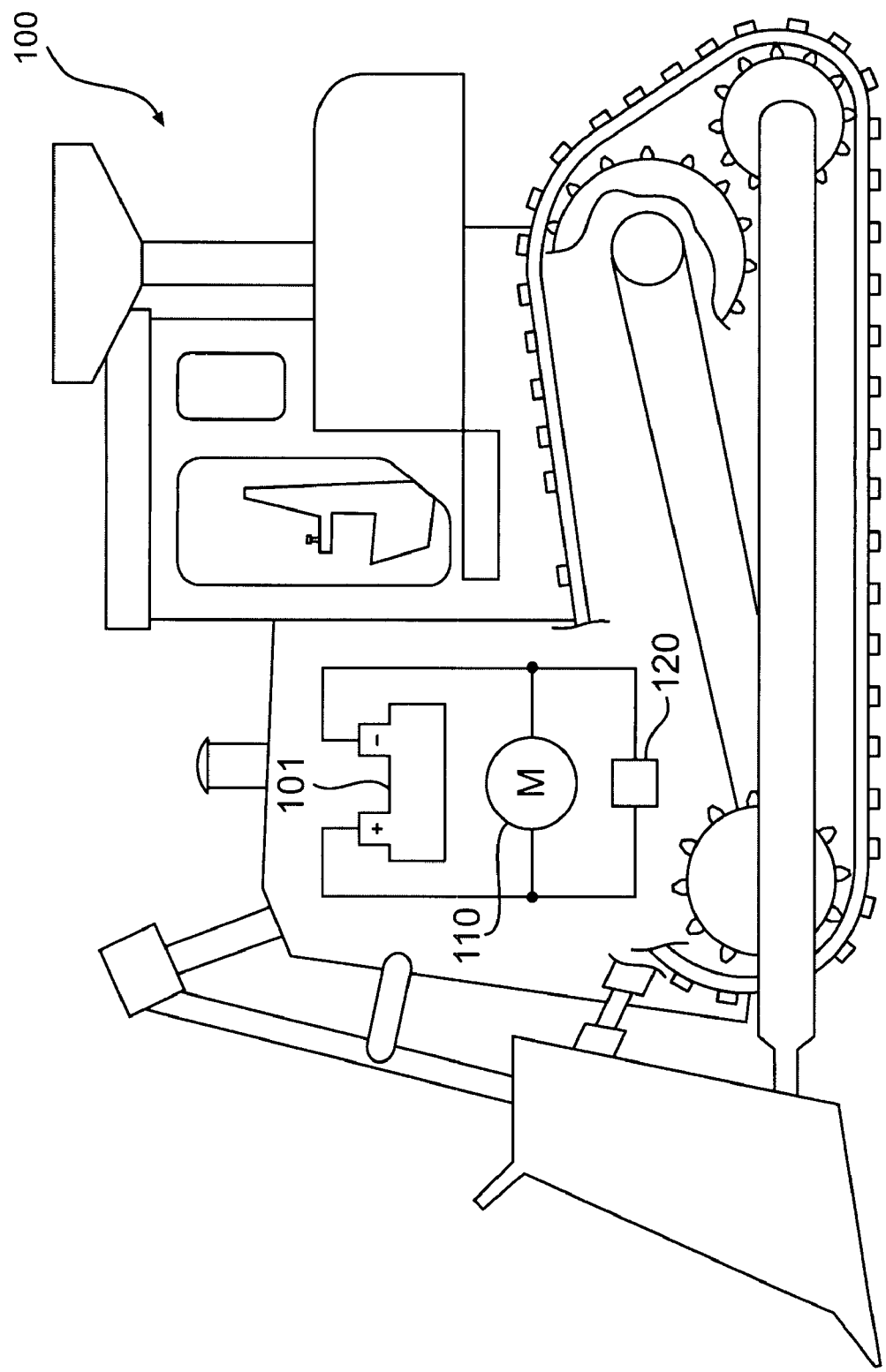
FIG. 1 illustrates a machine consistent with an exemplary disclosed embodiment.

FIG. 1 illustrates an exemplary disclosed machine 100 consistent with certain disclosed embodiments. Machine 100 may include, among other things, a power source 101, one or more electric loads (or high-voltage sources) 110, and a high voltage indication system 120. Machine, as the term is used herein, refers to a fixed or mobile machine that may perform some type of operation associated with a particular industry, such as mining, construction, farming, etc. and operate between or within work environments (e.g., a construction site, mine site, power plant, etc.) A non-limiting example of a fixed machine includes an engine system operating in a plant or off-shore environment (e.g., off-shore drilling platform). Non-limiting examples of mobile machines include commercial machines, such as trucks, cranes, earth moving vehicle, mining vehicles, backhoes, material handling equipment, farming equipment, marine vessels, on-highway vehicles, or any other type of movable machine that operates in a work environment.

Power source 101 may include various components configured to provide electric power for use by one or more systems of machine 100. For instance, power source 101 may include a generator driven by an engine, such as a combustion engine. Alternatively, power source 101 may include any other suitable device for providing a power output such as, for example, a battery, a fuel cell, or any other type of power source configured to provide electrical power to machine 100.

According to one embodiment, electric load 110 may be an electric motor, such as, for example, an AC induction motor, a brushless DC motor, a variable or switched reluctance motor, a stepper motor, a linear motor, or any other type of motor. The electric motor may be coupled to power source 101 and may be configured to convert at least a portion of the electric power output from power source 101 to mechanical energy for performing a task associated with machine 100. Electric load 110 may also be any other devices on a high-voltage system such as an electronic battery charger.

High voltage indication system 120 may be included as an integral part of electric load 110, such as part of a power control system for machine 100. Alternatively, high voltage indication system 120 may be external to electric load 110, such as, for example, as part of a separate electronic control module (ECM) associated with machine 100.

High voltage indication system 120 may be coupled to electric load 110 and configured to detect a voltage level associated with electric load 110 and provide an output indicative of the voltage level. For example, high voltage indication system 120 may be electrically connected to one or more energizing terminals of electric load 110 to measure the voltage potential associated with the terminals. Alternatively and/or additionally, voltage indication system 120 may be coupled to one or more components associated with electric load 110 to detect a specific voltage level associated with the respective component.

High-voltage indication system 120 may be configured to determine a voltage level and provide an output signal associated with the determined voltage level. According to one embodiment, high-voltage indication system 120 may be configured to detect a voltage level associated with one or more components of electric load 110, such as a high voltage capacitor or other charge-storing device. High-voltage indication system 120 may determine if a high-voltage condition exists (e.g., the voltage level is greater than a threshold voltage value) and provide an audible and/or visual warning signal indicative of the high-voltage condition.

High voltage indication system 120 may continuously and/or periodically monitor the voltage level of electric load 110 or its associated components. Accordingly, high voltage indication system 120 may provide one or more continuous warning signals until the high-voltage condition has subsided (e.g., the voltage level drops below a threshold voltage value).

According to one embodiment, a user of high-voltage indication system 120 may modify the threshold voltage value and/or the sensitivity of high-voltage indication system 120. For example, one or more circuit elements of high-voltage indication system 120 may be modified or replaced to adjust the sensitivity of the indication system (e.g., from a sensitivity of +/−1 volt to a sensitivity of +/−0.1 volts). Alternatively and/or additionally, a user may modify the threshold voltage value associated with high voltage indication system. Thus, high-voltage indication system 120 may be scaled to operate in systems with various voltage levels and sensitivity requirements.

Figure 2:
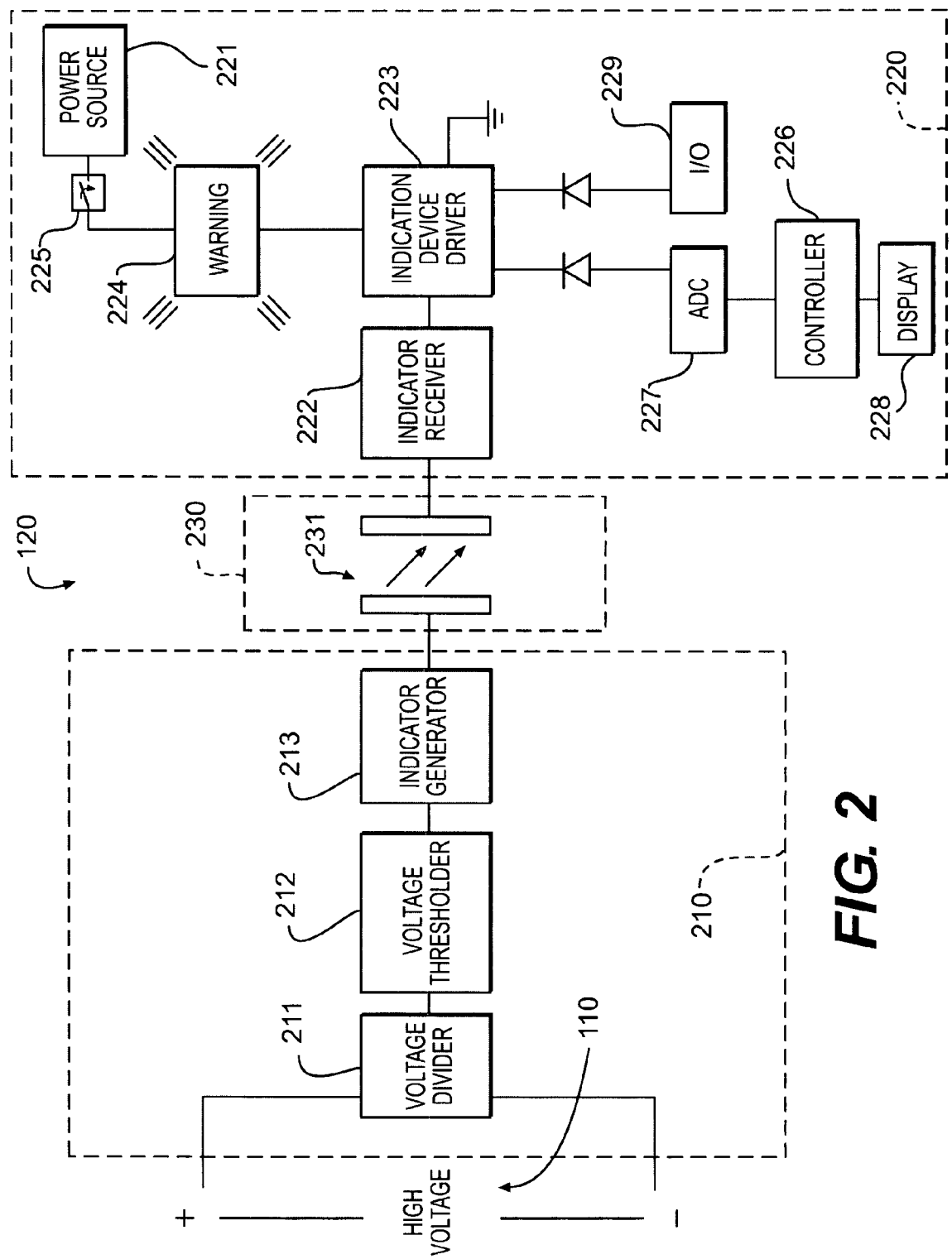
FIG. 2 provides a block diagram of a high voltage indication system consistent with an exemplary disclosed embodiment.

As illustrated in the block diagram of FIG. 2, high voltage indication system 120 may include, among other things, a voltage detector 210, an indicator 220 and an isolator 230 that couples voltage detector 210 to indicator 220. Voltage detector 210 may be electrically connected to one or more high voltage components associated electric load 110.

Voltage detector 210 may further include a voltage divider 211, a voltage thresholder 212, and an indicator generator 213. Voltage divider 211 may be electrically coupled to high-voltage source 110 to be measured, and configured to transform the voltage level associated with high-voltage source 110 to a desired level. For instance, voltage divider 211 may be connected in parallel to high-voltage source 110 and be configured to convert the voltage level associated with high-voltage source 110 to a different voltage, typically of a lower level, for use by one or more components associated with voltage detector 210. For example, voltage divider 211 may include at least two electrical components connected in series. Each of the at least two electrical components may bear a portion of the voltage associated with high-voltage source 110. The electrical components may have the same or different resistances. Furthermore, the resistances may be fixed or variable. The voltage level associated with each electrical component is proportional to the resistance of that electrical component. The sum of the voltages associated with all the components in series is equal to the voltage associated with high-voltage source 110. Voltage divider 211 may be coupled to voltage thresholder 212 and provide it with the voltage associated with one or more of the components in series. The voltage provided to voltage thresholder 212 may be associated with the voltage level via a voltage divider ratio determined by the configuration of voltage divider 211. For example, the voltage divider ratio may be adjusted by switching the connecting points on voltage divider 211 to include more or less components connected in series in voltage divider 211. The voltage divider ratio may also be adjusted by adjusting the resistances of one or more components connected in series in voltage divider 211. Moreover, voltage divider 211 may include a programmable interface that allows a user to specify a desired voltage divider ratio. Voltage divider 211 may be configured to transform AC or DC voltages.

Voltage thresholder 212 may include a voltage detection device, configured to compare an input voltage with a threshold voltage value, and provide an output. Via one terminal, voltage thresholder 212 may be electrically coupled to voltage divider 211 to receive an input signal. Via another terminal, voltage thresholder 212 may be electrically coupled to indicator generator 213 to provide an output signal. Voltage thresholder 212 may be further configured to adjust the output signal based on whether the input signal indicates a voltage higher than the threshold voltage value. For example, the output signal may be a small positive voltage when the input voltage is higher than the threshold voltage value. In another example, the output voltage may be a small negative voltage when the input voltage is less than or equal to than the threshold voltage value. According to one embodiment, the output of voltage thresholder 212 may provide power to the electrically coupled indicator generator 213. In one exemplary embodiment, the threshold voltage may be set as 50 volts, and any voltage values higher than 50 volts may be considered as high voltage. Voltage thresholder 212 may further include a programmable interface that allows a user to specify a desired value for the threshold voltage.

Indicator generator 213 may include a power source and an indication device, and be configured to generate an indication signal in response to the output of voltage thresholder 212. Indicator generator 213 may be electrically coupled to voltage thresholder 212. According to one embodiment, indicator generator 213 may be powered by the output of voltage thresholder 212. According to another embodiment, indicator generator 213 may incorporate a separate power source. In one embodiment, the power source may be a voltage power source that provides electrical power to indicator generator 213, such as, for example, a voltage source and a current source. The indication device may be activated by a signal associated with the output of the voltage thresholder. The signal, for instance, may be a voltage signal and, accordingly, the indication device may be a voltage activated indication device. The signal, for another instance, may also be a current signal and, accordingly, the indication device may be a current activated indication device. Once activated, the indication device may generate an indication signal, which may be in many possible forms, for example, electrical, optical, magnetic, electromagnetic, or audible.

Isolator 230 may include one or more isolation devices 231 to prevent the flow of current between voltage detector 210 and/or indicator 220. For example, voltage detector 210 may be coupled to indicator 220 via one or more optical isolators. Optical isolators may provide a mechanism for data transfer using an optical signal, while limiting the flow of current that could potentially interfere with and/or damage electrical systems. Alternatively, isolation devices 231 may include a magnetic isolation device, a transformer device, a wireless communication link (e.g., infrared, microwave, Bluetooth, etc.), a wireless (such as LED, microwave, or infrared) transmitter/detector pair, or any other suitable current isolation device.

Indicator 220 may include a power source 221, an indicator receiver 222, an indication device driver 223 and an indication device 224. Power source 221 may be a separate power source that is electrically independent from voltage detector 210 and high voltage source 110. Power source 221 may provide low power supply, such that low power dissipation devices and components could be used. According to one embodiment, power source 221 may include a low voltage DC power source, the voltage level of which may be lower than the power source for voltage detector 210. In one exemplary embodiment, for example, power source 221 may be a 24 volts battery. Indicator 220 may be electrically coupled to power source 221 via a power switch 225. Power switch 225 may shut down indicator 220 in necessary situations. Power switch 225, according to one embodiment, may also activate additional functions of indicator 220 upon its closure, such as, for example, a self-test function and a diagnostic function.

Indicator receiver 222 may be electrically coupled with the isolator, and configured to receive and transform the non-electrical indication signal, transferred by the isolator, to electrical signals. For example, indicator receiver 222 may transform optical indication signals to electrical currents. Indication device driver 223 may be electrically coupled to indicator receiver 222. Indication devices 224 may include at least one switch device that turns on indication devices 224, in response to the indication signal being received by indicator receiver 222.

One or more indication devices 224 may be operatively coupled to indication device driver 223, and configured to provide one or more warning signals indicative of a high voltage condition associated with electric load 110 to a user of machine 100. For instance, indication devices 224 may include any component configured to provide a warning signal to a user associated with machine 100 such as, for instance, a visual device (e.g., warning lamp, LCD display, LED lamp, etc.); an audible device (e.g., speaker, bell, chime, etc.); a wireless device (e.g., cell phone, pager, etc.); or any other type of output device. In one embodiment, an LED lamp may be coupled with an audible alarm to provide a combination audio/visual warning.

Indicator 220 may further include a controller 226, which may be coupled to indication device driver 223 via an analogue-to-digital convention (ADC) device 227. According to one embodiment, controller 226 may include one or more components configured to monitor one or more condition indicators, process the monitored condition indicators to determine the operation status of indicator 220. The condition indicator may be, for example, a current signal sampled from indicator 220. Controller 226 may be further coupled to display device 228 and output the operation status to the user of the machine 100 via display device 228.

According to one embodiment, controller 226 may be further configured to perform one or more control functions in response to the condition indicators. For example, controller 226 may be configured to perform one or more self-test functions, in response to the closure of a key-on switch 229. For another example, controller 226 may be configured to perform one or more diagnostic functions when one or more monitored condition indicators are out of range. Information relevant to these control functions may also be output to the user of the machine, via display device 228.

Figure 3:
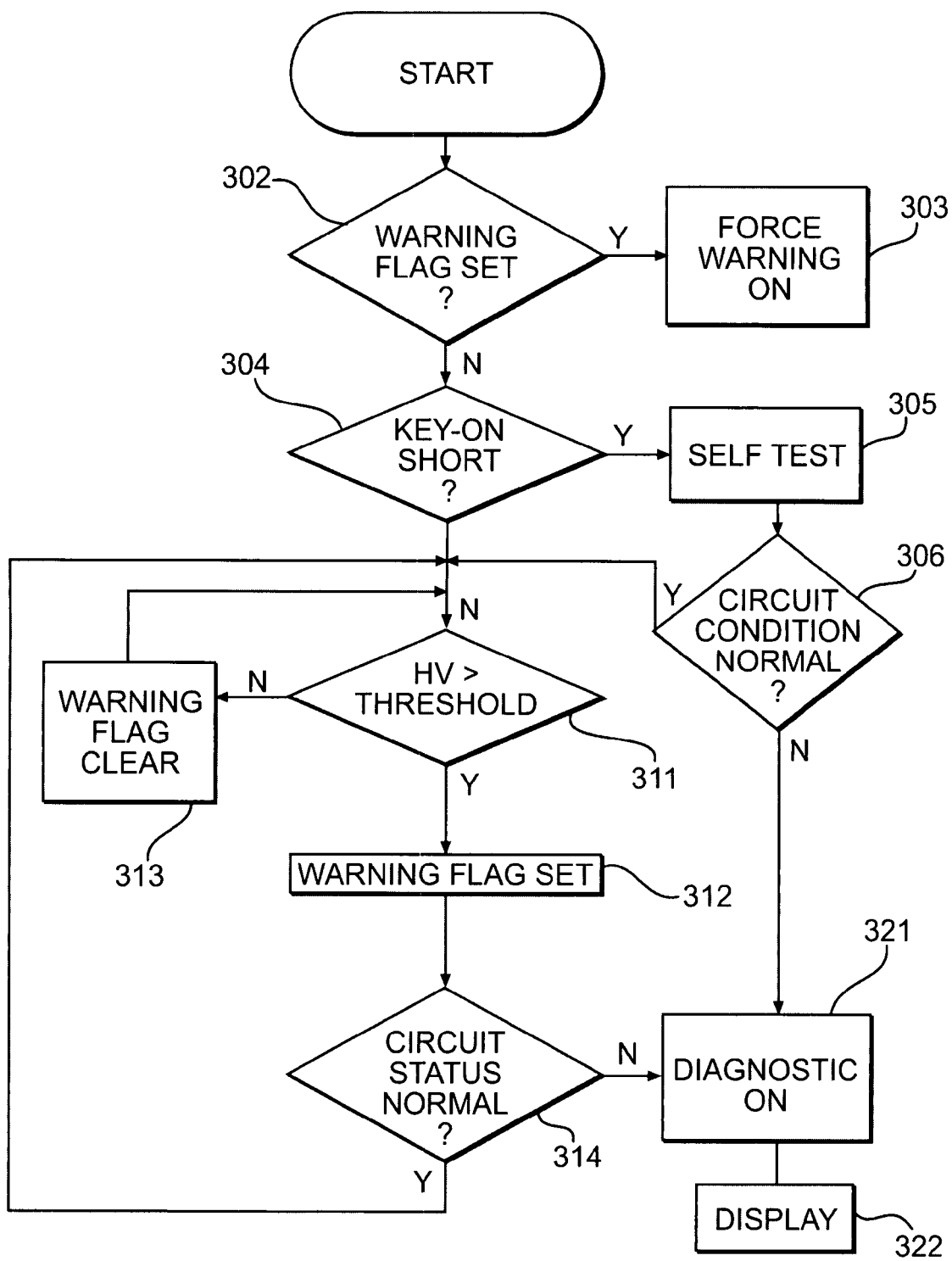
FIG. 3 provides a flowchart of an exemplary operation process for indicating high-voltage with self-test and diagnostic functions, consistent with the disclosed embodiment shown in FIG. 2.

FIG. 3 shows a flowchart of an exemplary operation process for indicating high-voltage with self-test and diagnostic functions, consistent with the disclosed embodiment shown in FIG. 2. FIG. 3 will be discussed in more detail in the following section to further illustrate the disclosed system and its operation.

INDUSTRIAL APPLICABILITY

Although the disclosed embodiments are described in association with a high-voltage indication system for a machine, the disclosed voltage indication system may be used in any environment where it may be desirable to monitor a voltage level and provide an output indicative of the monitored voltage. Specifically, the disclosed voltage indication system may detect a voltage level associated with an electric device, compare the detected voltage to a threshold voltage value, and provide an output signal indicative of a deviation of the detected voltage from the threshold voltage value. Moreover, the disclosed voltage indication system may be configured to provide diagnostic functions for ensuring that the voltage indication system is operating appropriately.

FIG. 3 shows a flow chart of an exemplary operation process for indicating high-voltage with self-test and diagnostic functions, consistent with the disclosed embodiments shown in FIG. 2. As shown in FIG. 3, controller 226 may first operate to detect whether a warning flag, indicative of high-voltage presence on the electric load 110, is set (step 302). If the warning flag is set, controller 226 may operate to force the warning on (step 303) by, for example, controlling the indication device driver 223. If the warning flag is not set, controller 226 may operate to determine whether the key-on time (i.e., the elapsed time since the closure of key-on switch 229) is shorter than a threshold period of time (step 304). If the key-on time is within the threshold period, controller 226 may then operate to perform a self-test to test whether indicator 220 is operational. According to one exemplary embodiment, the controller 226 may generate a testing signal, with properties similar to the indicator signal indicative of a high-voltage presence, and send the generated testing signal to indication device driver 223. Indication device driver 223 may then turn on indication devices 224. During the self-test, controller 226 may further operate to monitor one or more condition indicators, process these condition indictors and determine whether the status of indicator 220 is normal (step 306). Once controller 226 determines the status of indicator 220, the self-test is completed and controller 226 may immediately discontinue the testing signal.

According to the exemplary process shown in FIG. 3, if the self-test is considered to pass successfully or, alternatively, controller 226 determines that the key-on time is longer than the threshold period of time (step 304), the high-voltage indication system 120 may start detecting and indicating high-voltage presences. Once the voltage associated with electric load 110 is higher than a threshold voltage level (step 311), voltage detector 210 may generate a indicator signal indicative of the high-voltage and indicator 220 may receive the indicator signal via isolator 230, and indication devices 224 may be turned on accordingly. Meanwhile, controller 226 may be periodically or continuously informed about the high-voltage status. Once the high-voltage is detected, controller 226 may operate to set the warning flag (step 312), and otherwise clear the warning flag (step 313). Further, once the warning flag is set, controller 226 may operate to continuously monitor one or more condition indicators, process these condition indicators and determine whether the status of indicator 220 is normal (step 314). For example, controller 226 may operate to monitor the current flowing into one of indication devices 224, and determine whether the current is within the normal range.

According to the exemplary process shown in FIG. 3, if the test of step 305 fails, or the condition of indicator 220 is found to be not normal, the controller 226 may operate to perform one or more diagnostic functions to determine the faults associated with indicator 220 (step 321). For example, controller 226 may determine that indication device 224 is shorted or open, based on the monitored current flowing into that indication device 224. The faults determined by controller 226 may then be displayed on display device 228 (step 322).

According to one embodiment of the present application, with the incorporation of a separate power supply for the indicator 220, high-voltage indication system 120 may provide increased reliability over conventional voltage detectors. For example, should a machine employing the disclosed high-voltage indication system 120 lose primary power, high-voltage indication system 120 may continuously operate. Thus, in the event of a loss of primary power, high-voltage indication system 120 may ensure that the high-voltage warning devices operate while the high voltage signals dissipate. Additionally, according to another embodiment of the present application, the inclusion of a controller configured to perform self-test and/or diagnostic functions for serving the machine 100, such as, for example, self-test and diagnostic functions, may provide further increased reliability and reduce repair costs.

Furthermore, separate power source 221 incorporated by one embodiment of the present application may mitigate the requirements of using high power dissipation components within high-voltage detector 210. Lower power dissipation components may be available at reduced costs and may provide a smaller circuit and cooler operation. Therefore, the present application may provide cost, packaging, and reliability advantages over conventional voltage detectors.

In addition, high-voltage indication system 120 may include one or more isolation devices for minimizing and/or preventing the current flow between threshold detector 270 and the other components associated with high-voltage indication system 120. As a result, high-voltage indication system 120 may measure elements capable of storing extremely high voltages while isolating the remainder of the system from potential power surges from the high voltage elements. Thus, problems associated with system damage due to transient signals and power surges associated with conventional (non-isolated) voltage monitoring devices may be significantly reduced and/or eliminated.

It will be apparent to those skilled in the art that various modifications and variations can be made to the disclosed high-voltage indication system without departing from the scope of the invention. Other embodiments of the present disclosure will be apparent to those skilled in the art from consideration of the specification and practice of the present disclosure. It is intended that the specification and examples be considered as exemplary only, with a true scope of the present disclosure being indicated by the following claims and their equivalents.

What is claimed is:

1. A high-voltage indication system, comprising:
   a voltage detector powered by a first power source and coupled to detect a voltage level of an energy storage device associated with an electric motor/generator, the voltage detector configured to:
   measure the voltage level of the energy storage device;
   compare the voltage level of the energy storage device to a threshold voltage value; and
   provide an indication signal when the voltage level of the energy storage device is greater than the threshold voltage value; and
   an indicator powered by a second power source independent from the voltage detector, the indicator configured to:
   detect the indication signal provided by the voltage detector; and provide one or more warning signals in response to the indication signal,
   an electrical isolation device coupled to the voltage detector and the indicator and configured to facilitate the transfer of the indication signal from the voltage detector to the indicator via an electrically-isolated path through the electrical isolation device;
   wherein the indicator includes a controller, electrically isolated from the voltage detector and configured to:
   generate a test signal simulating a high-voltage indicator signal generated by the voltage detector;
   monitor a response of the indicator to the generated test signal; and
   determine, based on the monitored response, whether the indicator is operating within a normal operating range.

2. The indication system of claim 1, wherein the electrical isolation device includes at least one transmitter and receiver pair for transmitting the indication signal to the indicator.

3. The indication system of claim 1, wherein the electrical isolation device includes an optical device for wirelessly communicating the indication signal from the voltage detector to the indicator.

4. The indication system of claim 1, wherein the first power source has a voltage higher than that of the second power source.

5. The indication system of claim 1, wherein the controller is further configured to:
   display one or more faults if the indicator is operating outside of the normal range.

6. The indication system of claim 5, wherein the controller is further configured to perform one or more diagnostics if the indicator is operating outside of the normal range.

7. A method of indicating high-voltage, comprising a step of high-voltage detection comprising:
   determining, by a controller associated with a voltage indicator, whether a key-on time is within a threshold period;
   if the key-on time is within the threshold period, the method further comprising:
      generating a test signal simulating a high-voltage indicator signal generated by the voltage detector;
      monitoring a response of the indicator to the generated test signal; and
      determining, based on the monitored response, whether the indicator is operating within a normal operating range;
   if the key-on time is not within the threshold period or if the indicator is operating according to a normal operating range, the method further comprising:
      measuring, by a voltage detector powered by a first power source, a voltage level of an energy storage device associated with an electric motor/generator;
      comparing, by the voltage detector, the voltage level of the energy storage device with a threshold voltage value; and
      generating and transmitting, by the voltage detector, an indication signal when the voltage level of the energy storage device exceeds the threshold voltage value; and
   indicating, by the voltage indicator, a high-voltage condition of the energy storage device, the indicating comprising:
      receiving the indication signal; and
      generating one or more warning signals to indicate the high-voltage condition.

8. The method of claim 7, further including monitoring the indicator, and performing one or more diagnostic functions if the indicator is operating outside of the normal range.

9. The method of claim 7, wherein the threshold voltage value is set by a user via a programmable interface.

10. A machine, comprising:
   an electric motor/generator;
   an energy storage device coupled to receive power from or provide power to the electric motor/generator;
   a high-voltage indication system operatively coupled to detect a high-voltage associated with the energy storage device, wherein the high-voltage indication system includes:
      a voltage detector powered by a first power source and coupled to detect a voltage level of the energy storage device, the voltage detector configured to:
         measure a voltage level of the energy storage device;
         compare the voltage level of the energy storage device to a threshold voltage value; and
         provide an indication signal when the voltage level of the energy storage device is greater than the threshold voltage value; and
      an indicator, powered by a second power source independent from the voltage detector, the indicator configured to:
         detect the indication signal from the voltage detector; and
         provide one or more warning signals in response to the indication signal;
      an electrical isolation device coupled to the voltage detector and the indicator and configured to facilitate the transfer of the indication signal from the voltage detector to the indicator via an electrically-isolated path through the electrical isolation device;
   wherein the indicator includes a controller, electrically isolated from the voltage detector and configured to:
      generate a test signal simulating a high-voltage indicator signal generated by the voltage detector;
      monitor a response of the indicator to the generated test signal; and
      determine, based on the monitored response, whether the indicator is operating within a normal operating range.

11. The machine of claim 10, wherein the electrical isolation device includes at least one transmitter and receiver pair for transmitting the indication signal to the indicator.

12. The machine of claim 10, wherein the first power source has a voltage higher than that of the first power source.

13. The machine of claim 10, wherein the controller is further configured to:
   display one or more faults if the indicator is indicator is operating outside of the normal operating range.

14. The machine of claim 13, wherein the controller is further configured to perform one or more diagnostics if the indicator is operating outside of the normal range.

* * * * *